United States Patent
Yew et al.

[11] Patent Number: 6,137,164
[45] Date of Patent: Oct. 24, 2000

[54] THIN STACKED INTEGRATED CIRCUIT DEVICE

[75] Inventors: Chee Klang Yew, Woodlands; Siu Waf Low, Lengkok Angsa; Min Yu Chan, Braddell Hill, all of Singapore

[73] Assignee: Texas Instruments Incorporated, Dallas, Tex.

[21] Appl. No.: 09/401,568

[22] Filed: Sep. 22, 1999

Related U.S. Application Data

[60] Provisional application No. 60/078,056, Mar. 16, 1998.

[51] Int. Cl.[7] .................................................. H01L 23/02
[52] U.S. Cl. ........................ 257/686; 257/737; 257/738; 257/774; 257/778; 257/723; 257/724; 257/780; 361/760; 361/767; 361/770; 361/771
[58] Field of Search ...................... 257/686, 737, 257/738, 773, 774, 777, 778, 723, 779, 780, 724; 174/258, 260, 261, 262; 361/748, 760, 767, 770, 771, 792, 795

[56] References Cited

U.S. PATENT DOCUMENTS

| | | | |
|---|---|---|---|
| 3,577,037 | 5/1971 | Di Pietro | 257/621 |
| 5,347,162 | 9/1994 | Pasch | 257/773 |
| 5,438,224 | 8/1995 | Papageorge et al. | 257/777 |
| 5,468,681 | 11/1995 | Pasch | 438/108 |
| 5,477,160 | 12/1995 | Love | 324/755 |
| 5,483,421 | 1/1996 | Gedney et al. | 361/771 |
| 5,759,047 | 6/1998 | Brodshy et al. | 439/66 |
| 5,786,628 | 7/1998 | Beilstein, Jr. et al. | 257/684 |
| 5,815,374 | 9/1998 | Howell | 361/768 |
| 5,918,113 | 6/1999 | Higashi et al. | 438/119 |
| 5,958,590 | 9/1999 | kang et al. | 428/403 |
| 5,965,064 | 10/1999 | Yamada et al. | 252/512 |
| 5,977,640 | 11/1999 | Bertin et al. | 257/777 |
| 5,984,691 | 11/1999 | Brodsky et al. | 439/66 |
| 6,013,948 | 1/2000 | Akram et al. | 257/698 |

FOREIGN PATENT DOCUMENTS 7-176684  7/1995  Japan .

*Primary Examiner*—John Guay
*Assistant Examiner*—Alonzo Chambliss
*Attorney, Agent, or Firm*—Gary C. Honeycutt; Fred Telecky

[57] ABSTRACT

A thin, stacked face-to-face integrated circuit packaging structure includes a chips attached to both major surfaces of a rigid interposer, and interconnected by printed wiring traces and vias to external solder ball contacts attached to the interposer.

10 Claims, 4 Drawing Sheets

THIN STACKED INTEGRATED CIRCUIT DEVICE

CROSS-REFERENCE TO APPLICATIONS

This application claims priority under 35 USC § 119 based upon application Ser. No. 9803203, filed Sep. 29, 1998 in Singapore.

This application is related to co-assigned application Ser. No. 60/078056 filed Mar. 16, 1998 (TI docket number TI-26208) and to application Ser. No. 08/863848 filed May 27, 1997 (TI docket number TI-19653).

TECHNICAL FIELDS

This invention relates generally to the field of integrated circuits and in particular to a packaging arrangement for an integrated circuit assembly.

BACKGROUND OF THE INVENTION

Increasing the density of integrated circuits, maximizing performance and lowering costs are ongoing goals of the electronic industry. In particular, portable systems and computers have spurred the efforts to define reliable packaging technologies for supplying circuits in the smallest possible area, and in many applications with increased operating speed.

Advances in interconnect technology have provided the key enablers toward these ends. Direct connection of the active surface of a semiconductor die to a substrate or package using solder balls for flip-chip attachment, furnished the basic technology for low inductance, area array assembly of integrated circuits, and in turn supports improved overall switching speed. Flip-chip technology was developed years ago, and has surged recently as more practical means of direct chip attach have evolved, and begun to replace wire bonding. The early technique of forming solder balls by evaporating, patterning and reflowing solders on semiconductor wafers as a means to make contact between the input/output pads on the chip and the substrate is being replaced. Techniques, such as plating solders or other metallic bumps, using solder or conductive polymers to adhere conductive spheres, or using conductive polymers or anisotropic conductive materials have been developed for direct attachment and electrical contact between chips and a substrate.

Not only are chips attached to substrates by direct chip attach, but packages such as ball grid array (BGA), chip scale packages (CSP), and board-on-chip (BOC) packages are attached to circuit boards or other second level interconnection by means of balls or bumps. These bump connected packages are beginning to replace leaded packages which require more circuit board area and have higher inductance. Ball sizes vary from those in the range of 75 microns used for flip-chip attachment to those greater than a millimeter in diameter for CSP and BGA attachment. FIG. 1A provides a cross sectional view of a flip-chip 105 assembly in a BGA package 106, and demonstrates the use of different ball sizes, i.e. solder balls 115 on the flip-chip assembly typically yield a stand off height of about 65 microns, whereas balls 116 on the BGA package have about 0.9 mm stand off.

Device performance is enhanced by the lower inductance of short, wide ball connections, as a replacement for long, thin wire bonds or lead conductors. These bumped devices may also have terminals in an array under the device, rather than at the perimeter, and thereby minimize conductor length. Substrate space is reduced by placing the terminals within the active area, and thereby supports increased packing density.

FIG. 1B shows a cross-sectional view of a BOC package which includes a thin, rigid printed wiring board 110 to which the active surface of the integrated circuit 111 is attached on one surface of the board by a tape 113 with adhesive on both sides, and ball connections 112 for contact to the second level of interconnection are placed on the opposite side of the board. The integrated circuit is electrically connected to the substrate board by wire bonds 114 or by direct chip attachment, and the contact area is protected by a polymeric potting 120 or molding compound. BOC packages are one of many forms of Chip Scale Packages (CSP), and may be very thin as a result of the printed wiring board thickness.

Often in order to make an electronic device functional, one or more integrated circuit chips may be coupled electronically, and conveniently the chips are positioned next to each other and are connected by circuitry on a circuit board. Multichip modules provide a means for fabricating subsystems by interconnecting chips on a common substrate or package. FIG. 2 demonstrates an example of such an assemblage wherein a die 201 may be connected by flip-chip terminals 202, or by wire bonds 203 to the substrate. The substrate 211 provides the interconnection both between the chips within the assembly, and to external contacts 230 which in turn will contact the second level of interconnection, such as a printed wiring board 220. In multichip assemblies interconnections between chips often provides a means for decreasing the total number of input/output pins on the module, as compared to the number required for individual components. Fewer input/output interconnections to the second level printed circuit board reduces area required for interconnections, and allows performance to be enhanced by shorter interconnections with lower inductance.

Common power and ground lines further decrease the input/outputs requirements and provide enhanced performance; multichip modules frequently have multilevel substrates to satisfy this need.

Another technique for increasing density of integrated circuit devices has been stacked packages and/or stacked chips. Two or more integrated circuit chips are stacked on top of each other, and in the conventional arrangement all chips face the same direction, i.e., downward, upward or side by side. A common example is Memory modules, either as chips or packaged units having similar size and type which are stacked face-to-back and are electrically interconnected vertically on the perimeter.

Leaded surface mount packages on double sided printed wiring boards were a forerunner of face-to-face stacked packages. Chips have also been stacked face-to-face on an interposer. One such assembly, shown in FIG. 3 provides a first flip-chip 301 positioned face-to-face with a second flip-chip 302 on an interposer 303 between the chips to provide electrical connection 313 among the flip-chip terminals 311, and to external circuitry terminal 315. This assembly uses a flex circuit as the interposer 303 between the facing flip-chips, and thus requires a separate mechanical support 320 to provide the interconnection between the interposer and a second level interconnection. This results in a complex and costly assembly. Moreover, the package height is increased by this arrangement.

It would be advantageous to develop a technique for increasing the packing density of integrated circuits, taking advantage of low inductance connectors, decreasing the number of input/output contacts as is found with multichip or stacked assembly, and makes use of low cost, readily available assembly materials for packaging. In particular, there is a need for increasing the density of memory circuits used in computers on SIMMs (single inline memory module) or circuit boards. This application must comprehend not only the area restrictions, but also the package height. Memory module applications would like to take advantage of the ability to double the memory capacity by stacking chips, but suffer no penalty in the space allotted for memory modules.

SUMMARY OF THE INVENTION

It is the primary object of the present invention to provide a novel packaging structure for a very thin integrated circuit packaging structure having a stacked chip arrangement for improved packing density and performance of integrated circuits devices. The above and other objects, features and advantages of the present invention will be apparent from the following descriptions.

It is an object of this invention to provide a face-to-face stacked integrated circuit arrangement on a thin, rigid interposer circuit board which includes external contact terminals, and electrical interconnections between the chips and from the chips to the external contacts.

It is an object of this invention to provide a integrated circuit packaging structure having an interposer which includes solder ball terminals which will be used to contact a next level of interconnect circuitry, such as printed wiring board or SIMM module.

It is further an object of this invention to provide a face-to-face integrated circuit packaging structure wherein the interposer comprises a low cost circuit board material which is both readily available, and makes use of technology for rapidly and cost effectively producing the interconnects. It is further an object of this invention to provide an interposer which may have multiple layers for electrical interconnections.

It is an object of this invention to provide a face-to-face stacked integrated circuit packaging structure wherein the rigid interposer supports chips which may be similar in size and shape, or may be very different in size and shape.

It is an object of this invention to provide a packaging structure wherein the terminals of the integrated circuit chips are attached directly to the corresponding contact pads on the interposer, and the direct chip attachment may take the form of soldered flip-chip using reflow techniques, may be conductive pedestals or spheres adhered to both surfaces by solder or conductive adhesive, or may be contacted by anisotropic conductive material.

It is an object of this invention to provide a packaging structure having low alpha emissivity materials in close proximity to active surfaces of the integrated circuits.

It is an object of this invention to provide a packaging structure including a material between the chips and the interposer to mitigate stresses on the contact joints, to enhance thermal dissipation from the chip surfaces, and which further protects against an ingress of moisture or other contaminants.

The preferred embodiment of the present invention includes a first and second integrated circuits chips which are identical in function, such as a pair of 64 Meg DRAMs, directly attached to a thin, rigid interposer. Input/output terminals common to the two chips are routed to a common via at the board perimeter which couples the interconnections and terminates in a solder ball external contact. In this embodiment, terminals on the two integrated circuit chips are common except for chip select and clock enable functions which are connected to designated individual external contacts. An underfill material fills the space between the each chip and the interposer board.

In yet another embodiment, an interposer board includes both a first and second surface having contact pads and interconnections to perimeter vias for a first and second integrated circuit chip of different sizes and function, such as a digital signal processor and a microprocessor. In this embodiment, the interposer includes additional metal rich layer between the surfaces with power and ground connections to the vias.

The drawings constitute a part of this specification and include exemplary embodiments to the invention which may be embodied in various forms. It is to be understood that in some instances aspects of the invention may be shown exaggerated or enlarged to facilitate and understanding of the invention.

DETAILED DESCRIPTION OF THE PREFERRED EMBODIMENT

Figure 1A:
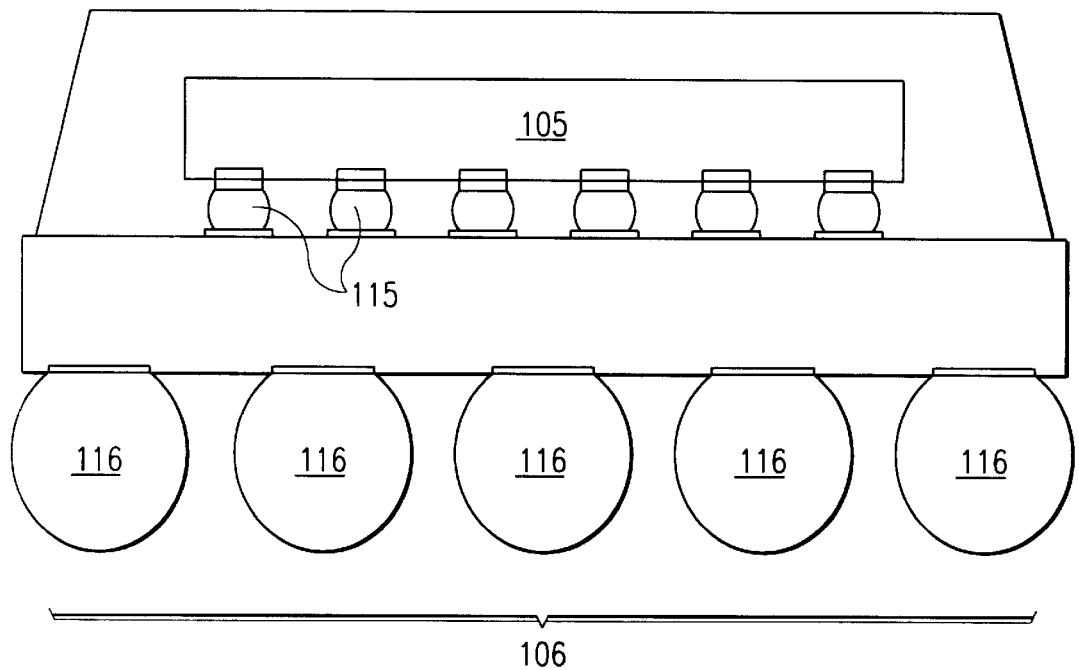
FIG. 1A demonstrates a flip-chip device in a BGA package (Prior art)
Figure 1B:
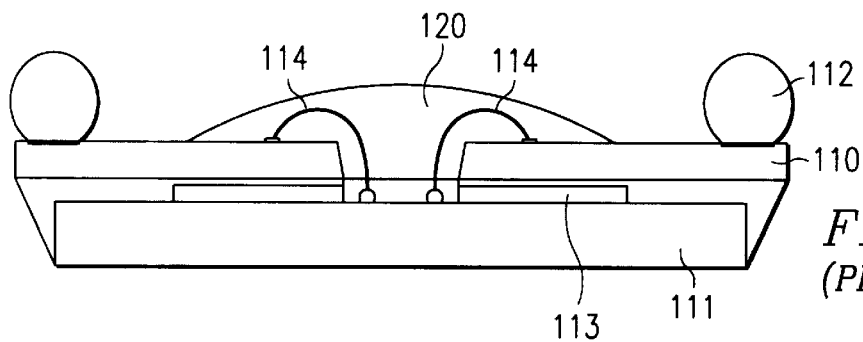
FIG. 1B shows an example of a Board-On-Chip (BOC) package (prior art).
Figure 2:
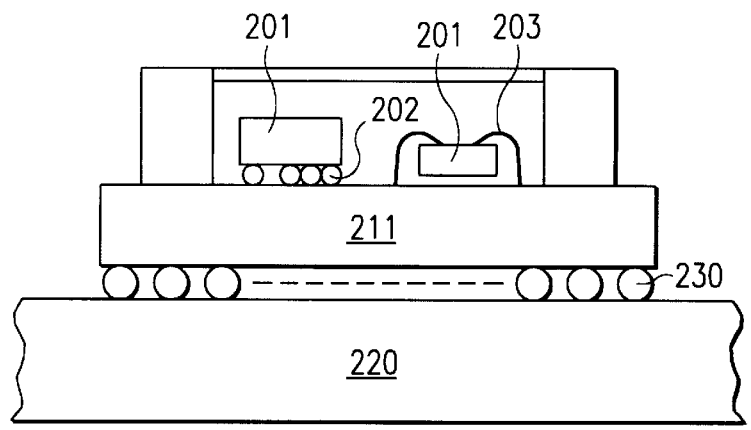
FIG. 2 shows a cross section of a multichip module. (Prior art)
Figure 3:
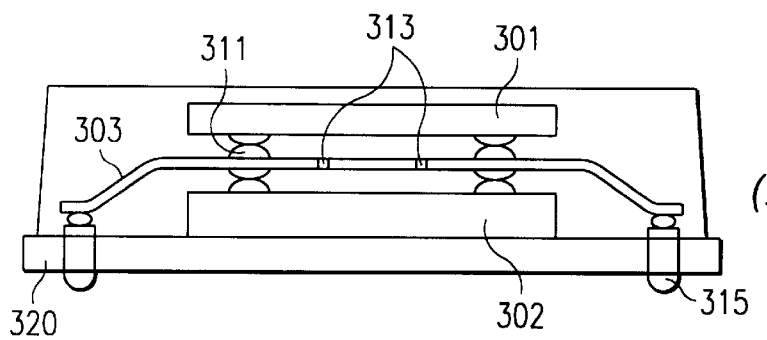
FIG. 3 demonstrates a stacked chip on flex interposer package. (Prior art)
Figure 4A:
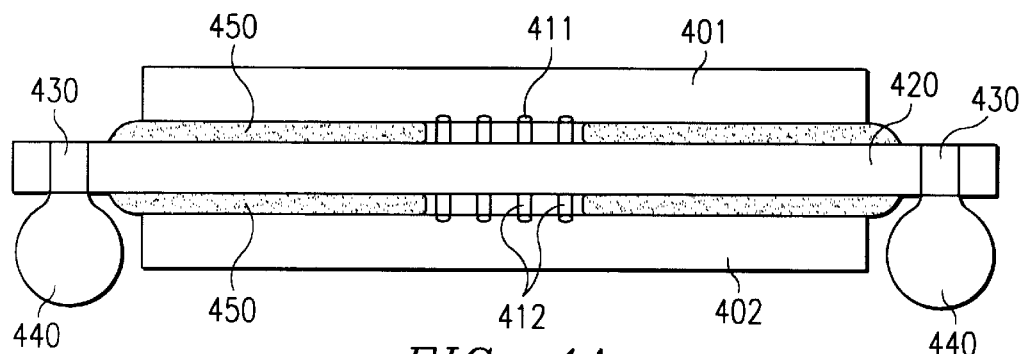
FIG. 4A is a cross sectional view of the present invention.

Turning now to the drawings which describe the current invention. In FIG. 4A there is shown a thin, face-to-face packaging structure which includes a first integrated circuit chip 401 having an array of electrical terminals 411 directly connected to a corresponding array of contact pads (not shown) on the first surface of a rigid interposer printed circuit board 420. A second integrated circuit 402 having an array of electrical terminals 412 is directly contacted to a corresponding array of contact pads (not shown) on the second surface of said interposer board 420. The interposer includes circuitry for electrically interconnecting designated electrical terminals on the first chip to those electrical terminals of the second chip, and interconnecting designated pads from either chip terminal to external contacts. Vias 430 through said interposer board near the perimeter support interconnection from the chip terminals 411 to external contacts which comprise solder balls 440. An electrical terminal on chip 402 which provides a common function with a terminal on chip 401 are routed to a common solder contact, and those terminals not common between the two integrated circuits are routed on the interposer to other solder ball contacts.

The solder balls 440 provide a means of electrical and mechanical contact to the next level of interconnection which may be any motherboard, SIMM, DIMM or other external circuit by the user. Solder balls is intended to include any form of solder connection which may be in the form of spheres, or columns and may vary in size from about 0.4 mm to about 0.9 mm. Infrastructure within the industry is adapted to eutectic tin/lead solder and as such is the preferred embodiment, but is not limited to this solder form.

The interposer 420 comprises a rigid substrate in the range of 0.15 mm to 0.30 mm thickness having printed interconnect circuitry disposed on both surfaces. Said interconnect circuitry includes an array of contact pads which correspond to the chip terminals, metal traces to connect said pads to vias through the interposer which terminate at external contact terminals. A diagram of the interconnect circuitry will be discussed later in connection with FIG. 5.

A thin, rigid interposer for face-to-face integrated circuit packaging structures has significant advantages as compared to known face-to face packaging structures. The rigid interposer of this invention includes external contacts attached directly to the interposer. Prior art has taught a flexible interposer on which subsequent to connecting the chips, the interposer is attached to a separate substrate board having external contacts. The known thicker structure having both an interposer and a support board for external contacts does not meet the need for very thin structures required in many compact applications.

In addition, a single connection between the interposer interconnection and the external bump contact is provided in the current invention, as opposed to multiple connections required by the known art for contacting the interposer and then a substrate board. Such additional connections increase the resistance and inductance of the circuitry with consequent loss in speed of operation.

Further advantages of the interposer of the current invention are realized in that readily available materials and technologies which are amenable to rapid changes in interconnect designs are specified. The interposer consisting of conventional printed wiring board offers a much lower cost material than flexible polyimide film with photolithographically defined interconnections. Multilayer printed wiring boards are well known, whereas multilayer flexible circuits are difficult to manufacture and are costly. In the current invention, only one interposer is required for two integrated circuits, whereas in some face-to-face chip arrangements a separate interconnect structure or lead frame is required for each chip.

Further, the rigid interposer of the current invention allows chip sizes and placement of their electrical terminals to be random, whereas flexible interposers are more amenable to similar sized chips which provide some rigidity to the structure. Printed wiring interconnections readily accommodate area array, perimeter or centrally located electrical terminals of the integrated circuits. Latitude in the method of direct chip attachment is also afforded by the self supporting, rigid interposer of the current invention.

Figure 5:
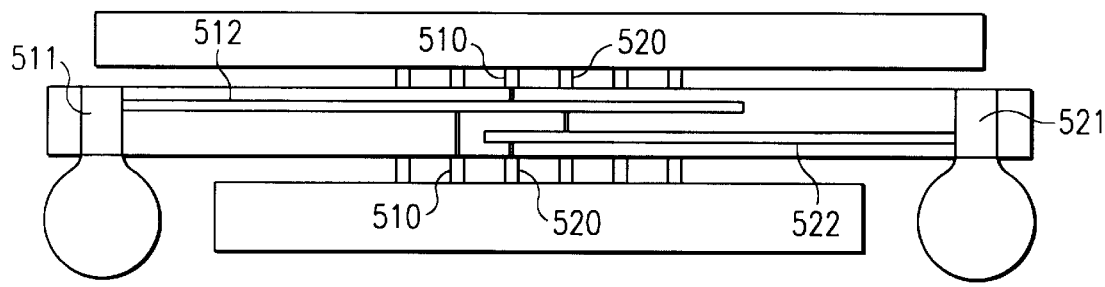
FIG. 5 demonstrates a cross sectional view of a thin package assembly having power and ground plane.

Further, the interposer may include multiple electrical interconnection layers. Multilayer substrates can be a means to further reduce the number of input/output connections by providing common ground and/or power planes for the multichip devices, and are applicable to this invention. Operating performance, reduced area and thermal dissipation are improved by such metal rich planes. FIG. 5 shows a wiring board where common ground contacts 510 are connected by a ground plane 512 to a common via 511 and external contact. In a similar manner, common power contacts are connected through a power plane 522 to a common via 521 and in turn to the external contact.

In the preferred embodiment of this invention, the interposer comprises a composite polymeric board, such as FR-4 which is readily available, low cost, and the manufacturing infrastructure is well established. Alternate polymeric or ceramic substrate materials are applicable to the invention, limited only by the specification of being thin, rigid and compatible with printed wiring. Printed circuit or wiring interconnect technology with copper traces having a gold flash comprises the preferred interconnections on the interposer. Technology for thin circuit boards having fine metal traces has been established and is used for such integrated circuits packaging structures as BOC (board-on-chip) devices previously disclosed in U.S. patent application Ser. No. 08/863848 (TI docket number TI-19653) which is incorporated herein by reference.

Returning now to FIG. 4A, space between the chips 401 and 402 and the interposer circuit board 420 is filled with an polymeric material 450 generically referred to as "underfill". The underfill material 450 comprises a thermosetting polymer compounded with thermally conductive, electrically insulating particles. The cured polymer serves to lower expansion and absorb some of the stresses arising from mismatch in thermal expansion between the chip and interposer board, to control the ingress of external contaminants, and to dissipate heat from the chip surfaces. Thermally conductive underfill allows heat generated at localized areas in the active circuits to be spread over larger areas and to be conducted away from the source.

A very thin layer of polymeric chip coating material (not shown) may be applied to the backside of the first chip, and may be beneficial for electrostatic protection. Chip coatings are readily available as either liquids or vacuum deposited polymers. It should be noted that the encapsulation is not required to effectuate the purpose of the present invention.

Figure 4B:
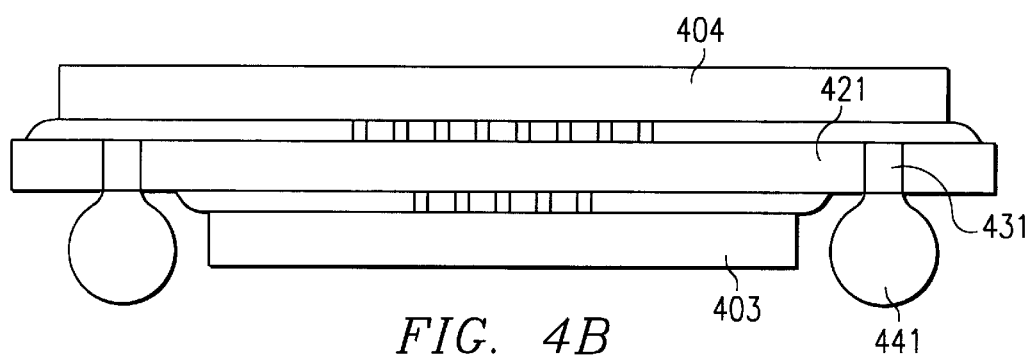
FIG. 4B shows an alternate arrangement with different chip sizes.

In practice the area of the packaging structure of this invention and the interposer board are related to those of the integrated circuit chips; the interposer board dimensions must exceed those of the lower chip 402, in order to allow space for solder balls 440 to be attached. FIG. 4B shows an arrangement wherein the chips are different size. In such an arrangement, chip 403 is smaller than chip 404, and is within the area of the external bumps, but chip 404 may extend to very near the edge of the interposer 421. It should be noted that this embodiment includes multiple rows of vias 431 and bumps 441, as dictated by the integrated circuit input/output design.

To explain further the overall packaging structures depicted in FIGS. 4A and 4B, the board is in the range of 0.15 mm to 0.35 mm thick, the integrated circuits are in the range of 0.25 mm to 0.5 mm thick, and the solder balls are in the range of 0.4 to 0.75 mm in diameter. In the preferred embodiment the stacked face-to-face integrated circuit device is about 1.3 mm thickness, and has an area only slightly greater than the larger chip. By way of comparison, a typical single chip, thin molded package is about 1.24 mm thick. The area of the face-to-face stacked integrated circuit packaging structure of this invention is only slightly greater than the larger chip size and readily meets the intent of a Chip Scale Package, but contains two chips.

Figure 6A:
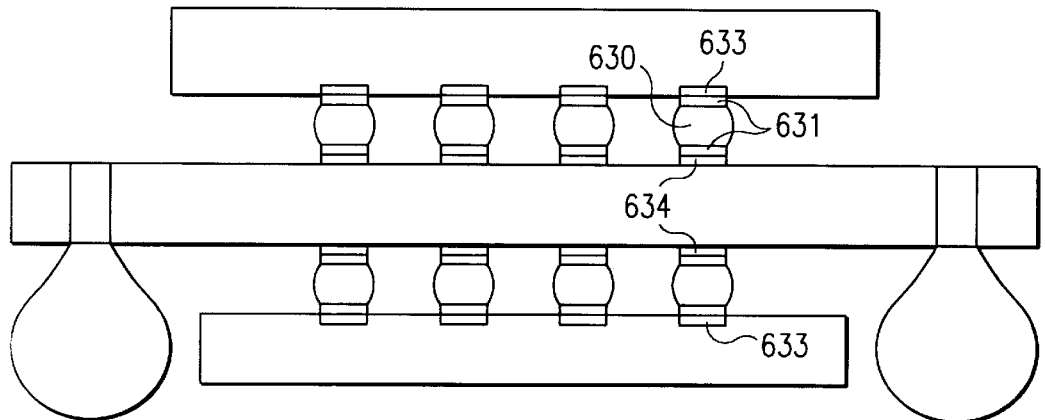
FIG. 6A demonstrates a cross sectional view of a direct chip attachment having bump contacts.

The present invention comprises a pair of integrated circuit chips having electrical terminals directly attached to contact pads on the interposer. The attachment may be by means of reflowing flip chip solder terminals, by attaching a conductive balls or pedestals using solder or conductive adhesive, or by anisotropic conductive film. Alternates to tin/lead solder bumps for terminals of chips are conductive polymers, lead free solders, metals such as copper, nickel or gold, or composite balls attached by means of either solder or conductive polymers. A number of composite bumps have been previously disclosed in application Ser. No. 60/078056 (TI docket number TI-26208) which is included herein by reference. FIG. 6A shows an example of direct chip attach using conductive balls 630 which have been preformed and attaching with a conductive adhesive 631 to both the contact pad of the chip 633 and the interposer 634.

Figure 6B:
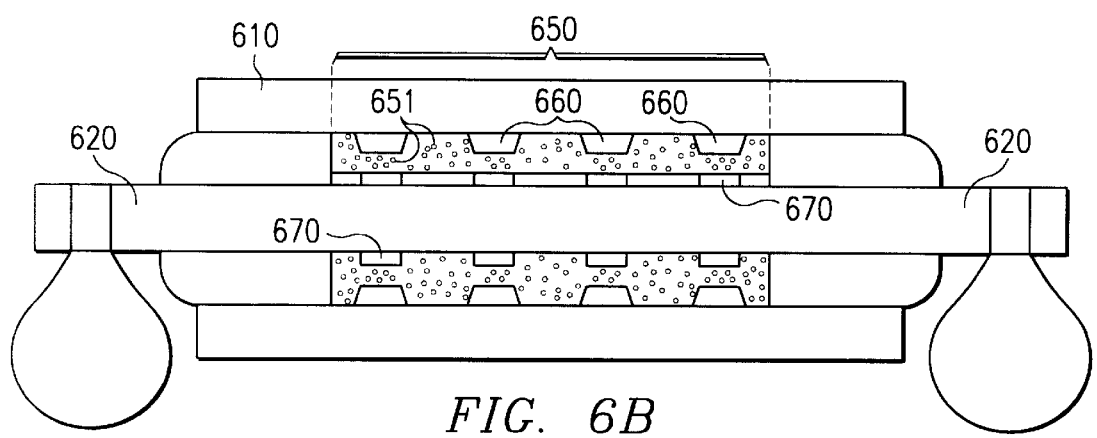
FIG. 6B demonstrates a cross sectional view of a direct chip attachment by anisotropic conductive adhesive.

Direct chip attachment using anisotropic conductive materials provides yet another method for electrically and mechanically connecting terminals of the chips to the interposer board of the current invention. In FIG. 6B an anisotropic conductive material 650 typically a thermosetting polymer is sparingly loaded with metal particles 651. The polymer is compressed so that there are more particles between the bump terminals 660 of the chip 610 and the contact pads 670 of the interposer 620 than in the non-bumped areas. Compression from thermal or mechanical means causes an electrical contact to be made between the two circuits. In FIG. 6B, anisotropic materials are available either as films or as paste formulations.

Anisotropic materials, composite bump structures or lead free solders have a distinct advantages over lead (Pb) containing solders because they are available in materials which have little to no alpha emission. This is particularly advantageous to those integrated circuits which are subject to soft error failures.

In the preferred embodiment, the integrated circuit chips comprise memory circuits, such as DRAMs (dynamic random access memory) having the same input/output functions) on each device terminal, except for specific chip select terminals. Typically in memory circuits, the memory is increased in each generation of integrated circuits, for example 16 Mbit DRAM was followed by 64 Mbit DRAM. However, with a stacked chip configuration, the amount of memory may be doubled within the same area and same generation of circuit, such as two 16 Mbit chips to provide 32 Mbits of memory. This is often particularly desirable because of the new generation may not be available, or may be significantly higher in cost, or may require that the user reconfigure the receiving circuit board.

Figures 7A, 7B:
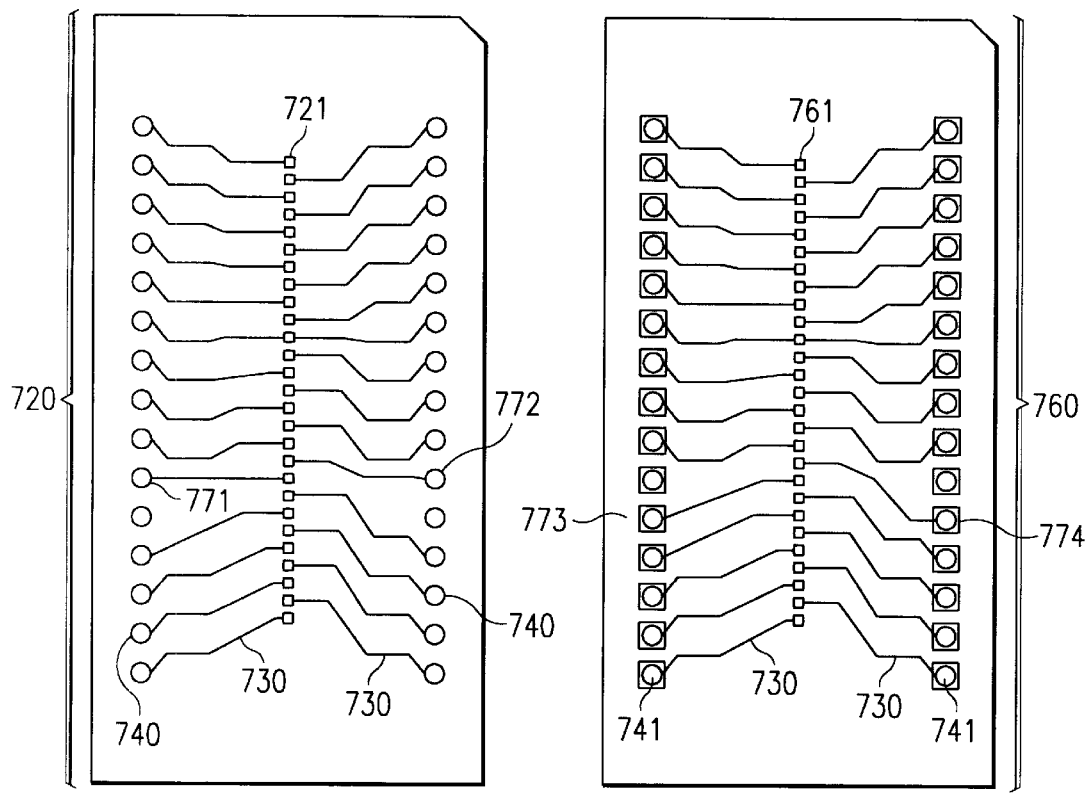
FIGS. 7A and 7B show a interconnection patterns for a DRAM assembly of the present invention.

FIG. 7A depicts an example of a the printed circuit interconnections on the first or upper surface 720 of the interposer board where the active surface of a DRAM integrated circuit chip (not shown) will be attached to contact pads 721. FIG. 7B depicts the second or bottom surface 760 of the interposer where the active surface of a second DRAM chip of the same design will be connected, face-up toward the second surface 760 of the interposer at contact pads 761. Electrical terminals of all circuits are common with the exception of Chip Select 771 and Clock Enable 771 terminals on the first interposer surface 720, and Chip Select 773 and Clock Enable 774 on the second surface 760. Terminals common to both devices are routed to conductive vias 740 through the interposer. On the second surface 760, the vias terminate in external contact terminals 741 at the location of the via. Metal traces 730 interconnect the contact pads to vias and to external contacts. In the preferred embodiment, chip terminals are located along the long axis of the chip in the center and require no changes in the routing on either surface of the interposer except at the chip select 771 and 773 and clock enable terminals 772 and 774. These contacts are routed to an individual external terminal for each device.

Interposer conductors 730 are metallic traces typically comprised of copper which interconnect circuits within the packaging structure, and between each of the integrated circuits and an external contact point. Interconnections between chips serves both to decrease the total number of external contacts required for the system, and to provide very short conductor lengths between chips. The potential for high speed performance of the device of this invention is supported by short interconnections and by direct chip attachment.

Figure 8:
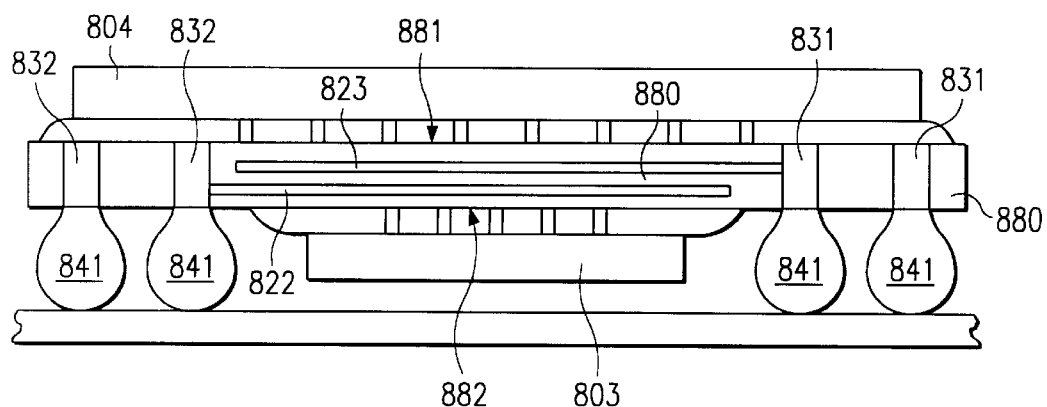
FIG. 8 shows a cross sectional view of a packaging structure with different size chips, multiple rows of external connectors, and multilayer interposer.

In yet another embodiment as shown in FIG. 8, an interposer board 880 includes a first surface 881 and a second surface 882 having contact pads and connections to perimeter vias for a first and second integrated circuit chips of different sizes and function, such as a digital signal processor and a microprocessor. An example of this type of packaging structure given in FIG. 8, wherein the chips 803 and 804 are dissimilar in area. In this embodiment, the smaller chip 403 is attached to the second surface 882 so that space is allowed for solder bumps 841. The larger chip 804 is attached to the first surface 881 and may be approximately the same size as the interposer board.

This second embodiment takes advantage of additional features made possible by the rigid printed wiring board construction of the interposer 880. Multiple rows of external contact solder bumps 841 accommodate higher pin count devices. A another feature made possible by the printed wiring board construction is that the board includes metal rich layers 822 and 823 with power and ground connections to the vias.

In summary, the present invention provides a novel stacked face-to-face integrated circuit packaging structure which supports a need for very thin, high density and high performance devices. A rigid interposer allows two chips to be directly attached to the interposer and to external contacts affixed to the same interposer. While the invention has been described in connection with preferred embodiments, it is not intended to limit the scope of the invention to a particular form set forth, but on the contrary, it is intended to cover alternatives, modifications, and equivalents as may be included within the spirit of the invention within the spirit and scope of the invention as defined by the appended claims.

What is claimed is:

1. A thin face-to-face stacked integrated circuit packaging structure comprising:

a rigid interposer board having a first surface and a second surface with printed wiring circuits disposed on each surface for mounting an integrated circuit chip on each surface; and said two integrated circuit chips having an array of electrical terminals connected electrically and mechanically to contact pads on the first and the second surfaces of said interposer board by a conductor having low alpha emissivity; and said integrated circuits terminals electrically interconnected by printed metal traces on said interposer board to conductive vias between the first and second surfaces; and said vias terminate in external connectors which comprise solder on the lower (or second) surface of the structure which comprise solder balls; and said structure having perimeters slightly greater than the larger chip, and the thickness of the structure is in the range of 1.25 mm to 1.5 mm, and the space between said chips and interposer filled with an underfill polymer formulated with an electrically insulating, thermally conductive powder.

2. A device as in claim 1, wherein the electrical terminals of the integrated circuit are connected to the interposer by flip chip reflowed solder.

3. A device as in claim 1, wherein the electrical terminals of the integrated circuit are connected to the interposer by anisotropic conductive adhesive.

4. A device as in claim 3, wherein the anisotropic conductive adhesive has low alpha particle emission.

5. A device as in claim 1, wherein an underfill polymer formulated with an electrically insulating, thermally conductive powder occupies the space between said chips and said interposer.

6. A device as in claim 2, wherein said electrical terminals of each chip are located in an area array, around the perimeter, in the center or any combination thereof.

7. A device as in claim 1, wherein said interposer board comprises a filled polymeric material made of FR-4.

8. A device as in claim 1, wherein said interposer includes more than two levels of printed wiring circuitry.

9. A device as in claim 8, wherein said vias provide a means of interconnection between selected terminals of the two integrated circuits, a means of contact to inner level conductor layers on a circuit board, as well as to the external contacts.

10. A device as in claim 1, wherein one of said integrated circuit chips has a smaller area than the other and the smallest chip is attached to the second or lower surface of said interposer and the largest chip is attached to the upper surface of the interposer.

* * * * *